(12) United States Patent
Hsu

(10) Patent No.: US 11,651,803 B2
(45) Date of Patent: May 16, 2023

(54) METHOD AND APPARATUS AND COMPUTER PROGRAM PRODUCT FOR READING DATA FROM MULTIPLE FLASH DIES

(71) Applicant: Silicon Motion, Inc., Zhubei (TW)

(72) Inventor: Mei-Yu Hsu, Taoyuan (TW)

(73) Assignee: SILICON MOTION, INC., Zhubei (TW)

( * ) Notice: Subject to any disclaimer, the term of this patent is extended or adjusted under 35 U.S.C. 154(b) by 0 days.

(21) Appl. No.: 17/508,175

(22) Filed: Oct. 22, 2021

(65) Prior Publication Data

US 2022/0189518 A1   Jun. 16, 2022

(30) Foreign Application Priority Data

Dec. 14, 2020 (CN) .......................... 202011465821.4

(51) Int. Cl.
*G11C 16/06* (2006.01)
*G11C 7/10* (2006.01)

(52) U.S. Cl.
CPC .......... *G11C 7/1096* (2013.01); *G11C 7/1066* (2013.01); *G11C 7/1069* (2013.01); *G11C 7/1093* (2013.01)

(58) Field of Classification Search
CPC ...................................... G11C 16/26
USPC ........................ 365/185.21, 185.33
See application file for complete search history.

(56) References Cited

U.S. PATENT DOCUMENTS

| 9,720,770 B2 | 8/2017 | Zhou et al. |
| 2005/0226046 A1 | 10/2005 | Lee et al. |
| 2011/0173462 A1 | 7/2011 | Wakrat et al. |
| 2022/0101895 A1* | 3/2022 | Jo .......................... G11C 7/1048 |

FOREIGN PATENT DOCUMENTS

| CN | 1677565 B | 6/2010 |
| TW | 201445312 A | 12/2014 |
| WO | WO 2008/138249 A1 | 11/2008 |

OTHER PUBLICATIONS

English Translation of Taiwanese Search Report from TIPO issued in Application No. 109143968, dated Jul. 27, 2021.

* cited by examiner

*Primary Examiner* — Hoai V Ho
(74) *Attorney, Agent, or Firm* — Birch, Stewart, Kolasch & Birch, LLP

(57) ABSTRACT

The invention relates to a method, an apparatus and a computer program product for reading data from multiple flash dies. The method is performed by a processing unit when loading and executing program code to include: issuing a read instruction to a flash interface to drive the flash interface to activate a data read operation for reading data from a location in a die; calculating an output time point corresponding to the read instruction; and issuing a random out instruction corresponding to the read instruction to the flash interface to drive the flash interface to store the data in a random access memory (RAM) when a current time reaches to, or is later than the output time point.

18 Claims, 6 Drawing Sheets

(A)

(B)

METHOD AND APPARATUS AND COMPUTER PROGRAM PRODUCT FOR READING DATA FROM MULTIPLE FLASH DIES

CROSS-REFERENCE TO RELATED APPLICATIONS

This application claims the benefit of Patent Application No. 202011465821.4, filed in China on Dec. 14, 2020; the entirety of which is incorporated herein by reference for all purposes.

BACKGROUND

The disclosure generally relates to storage devices and, more particularly, to a method, an apparatus and a computer program product for reading data from multiple flash dies.

Flash memory devices typically include NOR flash devices and NAND flash devices. NOR flash devices are random access—a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word.

Efficiently reading data from flash units in multiple dies has always been an important issue in flash controllers. Thus, it is desirable to have a method, an apparatus and a computer program product for reading data from multiple flash dies to shorten the time for performing the reading operations.

SUMMARY

In an aspect of the invention, an embodiment introduces a method for reading data from multiple flash dies, performed by a processing unit when loading and executing program code, to include: issuing a read instruction to a flash interface to drive the flash interface to activate a data read operation for reading data from a location in a die; calculating an output time point corresponding to the read instruction; and issuing a random out instruction corresponding to the read instruction to the flash interface to drive the flash interface to store the data in a random access memory (RAM) when a current time reaches to, or is later than the output time point.

In another aspect of the invention, an embodiment introduces a non-transitory computer program product for reading data from multiple flash dies. The non-transitory computer program product includes program code when being executed to realize the aforementioned method.

In still another aspect of the invention, an embodiment introduces an apparatus for reading data from multiple flash dies, at least including: a flash interface (I/F), coupled to a first die and a second die in a same channel; and a processing unit, coupled to the flash I/F. The processing unit is arranged operably to issue a first read instruction to the flash interface to drive the flash interface to activate a first data read operation for reading first data from a first location in the first die; calculate a first output time point corresponding to the first read instruction; issue a second read instruction to the flash interface to drive the flash interface to activate a second data read operation for reading second data from a second location in the second die; calculate a second output time point corresponding to the second read instruction; and issue a random out instruction corresponding to the second read instruction to the flash interface to drive the flash interface to store the second data in a RAM when a current time is earlier than the first output time point, and the current time reaches to, or is later than the second output time point.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
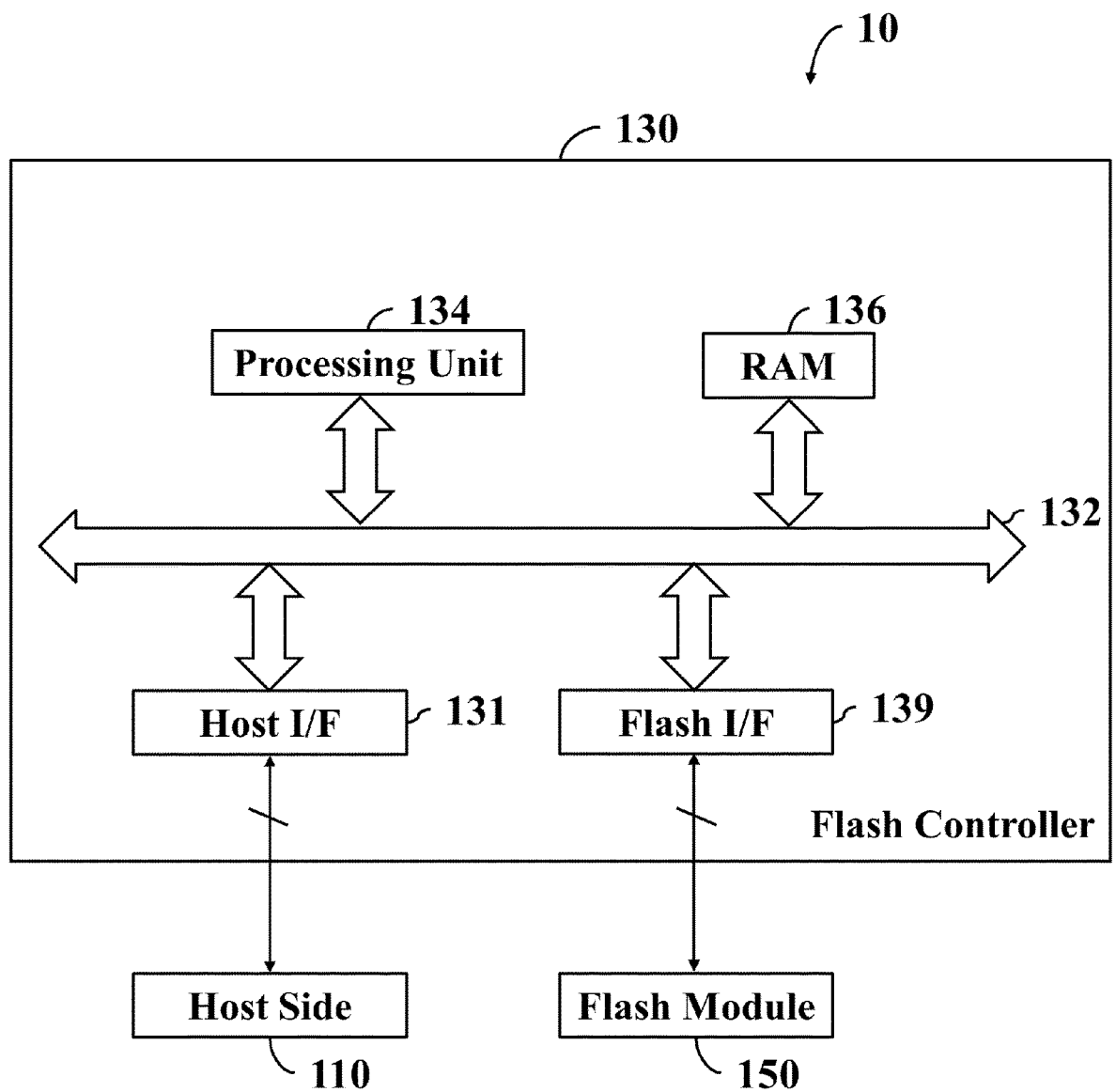
FIG. 1 is the system architecture of an electronic apparatus according to an embodiment of the invention.

Refer to FIG. 1. The electronic apparatus 10 includes a host side 110, a flash controller 130 and a flash module 150, and the flash controller 130 and the flash module 150 may be collectively referred to as a device side. The electronic apparatus 10 may be equipped with a Personal Computer (PC), a laptop PC, a tablet PC, a mobile phone, a digital camera, a digital recorder, or other consumer electronic products. The host side 110 and the host interface (I/F) 137 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The flash I/F 139 of the flash controller 130 and the flash module 150 may communicate with each other by a Double Data Rate (DDR) protocol, such as Open NAND Flash Interface (ONFI), DDR Toggle, or others. The flash controller 130 includes the processing unit 134 and the processing unit 134 may be implemented in numerous ways, such as with general-purpose hardware (e.g., a microcontroller unit, a single processor, multiple processors or graphics processing units capable of parallel computations, or others) that is programmed using firmware and/or software instructions to perform the functions recited herein. The processing unit 134 may receive host commands from the host side 110 through the host I/F 131, such as read commands, write commands, erase commands, etc., schedule and execute the host commands. The flash controller 130 includes the Random Access Memory (RAM) 136, which may be implemented in a Dynamic Random Access Memory (DRAM), a Static Random Access Memory (SRAM), or the combination thereof, for allocating space as a data buffer storing user data (also referred to as host data) that has been obtained from the host side 110 and is to be programmed into the flash module 150, and that has been read from the flash module 150 and is to be output to the host side 110. The RAM 136 stores necessary data in execution, such as variables, data tables, data abstracts, host-to-flash (H2F) tables, flash-to-host (F2H) tables, or others. The flash I/F 139 includes a NAND flash controller (NFC) to provide functions that are required to access to the flash module 150, such as a command sequencer, a Low Density Parity Check (LDDC) encoder/decoder, etc. The flash controller 130 may be equipped with the bus architecture 132 to couple components to each other to transmit data, addresses, control signals, etc. The components include but not limited to the host I/F 131, the processing unit 134, the RAM 136, and the flash I/F 139.

The flash module 150 provides huge storage space typically in hundred Gigabytes (GBs), or even several Terabytes (TBs), for storing a wide range of user data, such as high-resolution images, video files, etc. The flash module 150 includes control circuits and memory arrays containing memory cells, such as being configured as Single Level Cells (SLCs), Multi-Level Cells (MLCs), Triple Level Cells (TLCs), Quad-Level Cells (QLCs), or any combinations thereof. The processing unit 134 programs host data into a designated address (a destination address) of the flash module 150 and reads host data from a designated address (a source address) thereof through the flash I/F 139. The flash I/F 139 may use several electronic signals including a data line, a clock signal line and control signal lines for coordinating the command, address and data transfer with the flash module 150. The data line may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
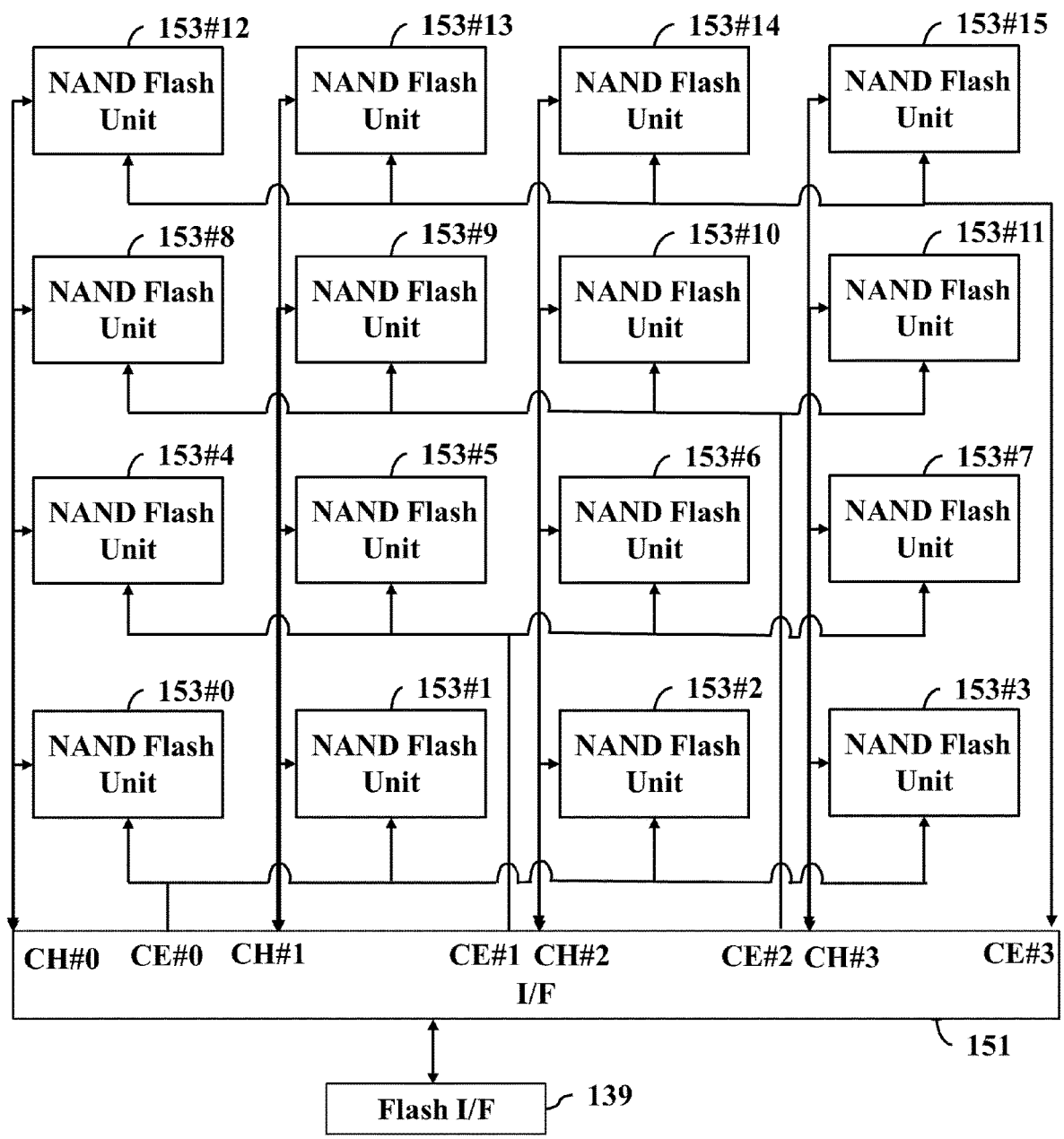
FIG. 2 is a schematic diagram illustrating a flash module according to an embodiment of the invention.

Refer to FIG. 2. The I/F 151 of the flash module 150 may include four I/O channels (hereinafter referred to as channels) CH #0 to CH #3 and each is connected to four NAND flash units, for example, the channel CH #0 is connected to the NAND flash units 150#0, 150#4, 150#8 and 150#12. Each NAND flash unit can be packaged in an independent die. The flash I/F 139 may issue one of the CE signals CE #0 to CE #3 through the I/F 151 to activate the NAND flash modules 153#0 to 153#3, the NAND flash modules 153#4 to 153#7, the NAND flash modules 153#8 to 153#11, or the NAND flash modules 153#12 to 153#15, and read data from or program data into the activated NAND flash modules in parallel.

The flash I/F 139 further includes an instruction queue, a cache, and a controller. The instruction queue sequentially stores a series of instructions issued by the processing unit 134 to complete a data reading operation according to their arrival times, such as read, wait for read busy (RB), polling NAND status, random out, and other instructions. The controller fetches and executes instructions from the instruction queue in a First-In First-Out (FIFO) manner. The cache provides temporary storage space for data read from the flash module 150.

In order to execute a host read command issued by the host side 110, or a background operation for improving the storage performance of the flash module 150, the processing unit 134 issues a read instruction to the flash I/F 139 to direct the flash I/F 139 to start a data read operation. The background operations include a wide range of processes, such as garbage collection (GC), wear leveling, read refresh, read reclaim, etc. The read instruction includes information about a die number, a row address, a column address, and so on, so that the controller uses data lines and control signals between the flash I/F 139 and the flash module 150 to read data from specific columns of a specific row in a designated NAND flash unit (for example, one of NAND flash units 153#0 to 153#15) in terms of the information. The NAND flash unit requires a period of time to prepare data, and uses a read ready signal to inform the flash I/F 139 after the completion of the data preparation. Next, the I/F 139 starts to obtain the designated data from the NAND flash unit through the data lines, and stores it in its cache. The time period after the processing unit 134 issues the read instruction to the flash I/F 139 until the flash I/F 139 starts to obtain the designated data from the flash module 150 may be referred to as the actual read lead time. Next, the processing unit 134 issues a random out instruction to the flash I/F 139 to instruct the flash I/F 139 to store the cached corresponding data in a designated location of the RAM 136 through the bus architecture 132. The random out instruction includes information about a die number, a row address, a column address, and so on, to associate with a previously issued read instruction, so that the controller can store the cached designated data in the designated location of the RAM 136. For example, the processing unit 134 may issue a read instruction including the die number "Die #0", the row address "R #100", and the column addresses "C #~4095" to the flash I/F 139, and after a read lead time, issue a random out instruction including the die number "Die #0", the row address "R #100", and the column addresses "C #~4095" to the flash I/F 139 to obtain data from the designated location in the flash module 150.

Figure 3:
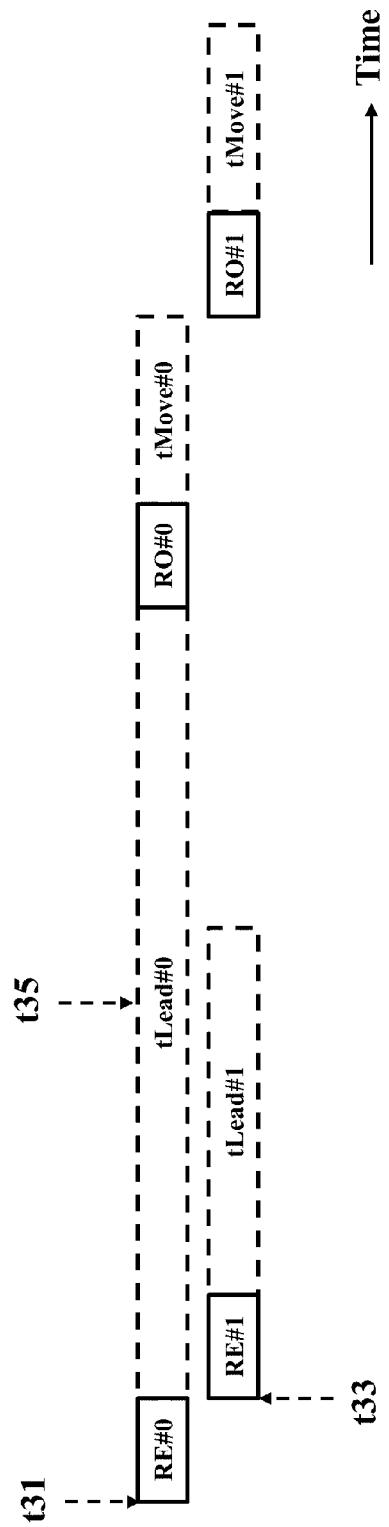
FIG. 3 is a sequence diagram showing issuances of read instructions and random out instructions according to some implementations.

In some implementations, the processing unit 134, after issuing a read instruction to the flash I/F 139, issues a corresponding wait for RB, or polling NAND status instruction to the NAND I/F 139, and determines whether the flash I/F 139 can start to obtain the designated data from the flash module 150 according to a reply from the flash I/F 139. When detecting that the data requested by the read instruction is ready, the processing unit 134 issues a corresponding random out instruction to the flash I/F 139. However, when receiving a wait for RB, or polling NAND status instruction, the flash I/F 139 would occupy the bus (also referred to as NAND bus) between the flash I/F 139 and the flash module 150 until the data specified by a corresponding read instruction has been acquired by the flash I/F 139 from the flash module 150 completely, resulting in a decrease in bandwidth utilization. Refer to FIG. 3 illustrating the example with two NAND flash units (also referred to as dies) in the same channel. The processing unit 134 issues read instructions "RE #0" and "RE #1" to the flash I/F 139 at the time points t31 and t33 sequentially, where the read instruction "RE #0" requests to read data from the designated location of the die "Die #0" in the flash module 150, and the read instruction "RE #1" requests to read data from the designated location of the die "Die #1" in the flash module 150. Next, the processing unit 134 issues a wait for RB, or polling NAND status instruction corresponding to the read instruction "RE #0" to the flash I/F 139 at the time point t35, so that the flash I/F 139 occupies the NAND bus for the read instruction "RE #0". Assume that the read lead time required for the read instruction "RE #0" is shown in the dotted box "tLead #0" in FIG. 3, the read lead time required for the read instruction "RE #1" is shown in the dotted box "tLead #1" in FIG. 3, and the read lead time "tLead #1" is shorter than the read lead time "tLead #0": After the time point t35, the NAND bus is occupied for the read instruction "RE #0", but no data is transmitted on the data lines thereof.

An embodiment of the invention introduces a method for reading data from multiple flash dies, performed by a processing unit when loading and executing program code. From an aspect of the invention, the method issues a read instruction to the flash I/F 139, calculates an output time point corresponding to the read instruction, and stores the output time point in a cache of the processing unit 134. When the current time reaches or exceeds the output time point for the read instruction, the processing unit 134 issues a corresponding random out instruction to the flash I/F 139. The method repeatedly executes a loop and is applied to the data read operations for all dies associated with a specific channel. The detailed description is as follows:

Step S410: One or more read instructions are issued to the flash I/F 139, and an output time point for each read instruction is calculated. It should be noted that, if no read instruction is to be executed, then this step can be omitted. Exemplary equation for calculating an output time point is as follows:

$$t_{out} = T_{now} + t_{prep}$$

where $t_{out}$ represents an output time point corresponding to a read instruction, $T_{now}$ represents the timestamp of the current time, at which the read instruction is issued, and $t_{prep}$ represents an estimated read lead time associated with the read instruction.

In some embodiments, $t_{prep}$ may be varied with different dies associated with the read instructions, as shown in Table 1:

TABLE 1

| Die Number | Read Lead Time |
|---|---|
| Die#0 | $t_{prep}$ = t0 |
| Die#1 | $t_{prep}$ = t1 |

The processing unit 134 may set the read lead time according to the die number associated with this read instruction. For example, if the data to be read for this read instruction is stored in the die Die #0, then the read lead time of this read instruction is set to $t_{prep}$=t0.

In alternative embodiments, $t_{prep}$ may be varied with different dies and different memory unit types associated with the read instructions, as shown in Table 2:

TABLE 2

| Die Number | SLC | TLC |
|---|---|---|
| Die#0 | $t_{prep}$ = t0 | $t_{prep}$ = t1 |
| Die#1 | $t_{prep}$ = t2 | $t_{prep}$ = t3 |

The processing unit 134 may set the read lead time according to the die number and the memory unit type associated with this read instruction. For example, if the data to be read for this read instruction is stored on the SLC page in the die Die #0, then the read lead time of this read instruction is set to $t_{prep}$=t0. If the data to be read for this read instruction is stored on the TLC page in the die Die #1, then the read lead time of this read instruction is set to $t_{prep}$=t3.

In alternative embodiments, $t_{prep}$ may be varied with different dies and different page types associated with the read instructions, as shown in Table 3:

TABLE 3

| Die Number | SLC Page | TLC/L Page | TLC/X Page | TLC/U Page |
|---|---|---|---|---|
| Die#0 | $t_{prep}$ = t0 | $t_{prep}$ = t1 | $t_{prep}$ = t2 | $t_{prep}$ = t3 |
| Die#1 | $t_{prep}$ = t4 | $t_{prep}$ = t5 | $t_{prep}$ = t6 | $t_{prep}$ = t7 |

Each die has multiple physical blocks, and each physical block can be configured as the SLC block or TLC block. Each memory unit in the SLC block stores one of two states, denoted as "0b0" or "0b1". Each word line of the SLC block may store one page of data, referred to as the SLC page. Each memory unit in the TLC block stores one of eight states, denoted as "0b000", "0b001", "0b010", "0b011", "0b100", "0b101", "0b110" or "0b111". Each word line of the TLC block may store three pages of data, including the lower (TLC/L) page, the middle (TLC/X) page, and the upper (TLC/U) page. The processing unit 134 may set the read lead time according to the die number and the page type associated with this read instruction. For example, if the data to be read for this read instruction is stored on the SLC page in the die Die #0, then the read lead time of this read instruction is set to $t_{prep}$=t0. If the data to be read for this read instruction is stored on the TLC/U page in the die Die #1, then the read lead time of this read instruction is set to $t_{prep}$=t7.

In alternative embodiments, the setting of $t_{prep}$ may be referred to the content of Table 4 as follows:

TABLE 4

| Die Number | SLC Page | QLC/L Page | QLC/X Page | QLC/U Page | QLC/T Page |
|---|---|---|---|---|---|
| Die#0 | $t_{prep}$ = t0 | $t_{prep}$ = t1 | $t_{prep}$ = t2 | $t_{prep}$ = t3 | $t_{prep}$ = t4 |
| Die#1 | $t_{prep}$ = t5 | $t_{prep}$ = t6 | $t_{prep}$ = t7 | $t_{prep}$ = t8 | $t_{prep}$ = t9 |

Each die has multiple physical blocks, and each physical block can be configured as the SLC block or TLC block. Each memory unit in the SLC block stores one of two states, denoted as "0b0" or "0b1". Each word line of the SLC block may store one page of data, referred to as the SLC page. Each memory unit in the QLC block stores one of sixteen states, denoted as one of "0b0000" to "0b1111". Each word line of the QLC block may store four pages of data, including the lower (QLC/L) page, the middle (QLC/X) page, the upper page (QLC/U), and the top (QLC/T) page. For example, if the data to be read for this read instruction is stored on the SLC page in the die Die #0, then the read lead time of this read instruction is set to $t_{prep}$=t0. If the data to be read for this read instruction is stored on the QLC/T page in the die Die #1, then the read lead time of this read instruction is set to $t_{prep}$=t9.

Step S420: A random out instruction corresponding to each read instruction is prepared and stored in the cache of the processing unit 134. It should be noted that, if no read instruction is to be executed, then this step can be omitted.

Step S430: The variable i is set to 0.

Figure 5:
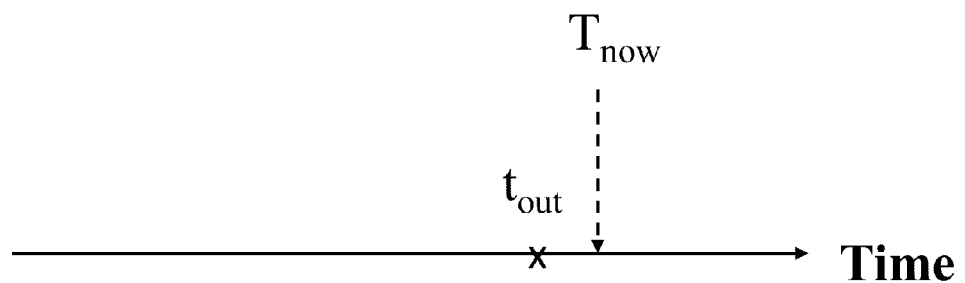
FIG. 5 is a schematic diagram of judging the sequence relationship between the current time and the output time point according to an embodiment of the invention.
Figure 5:
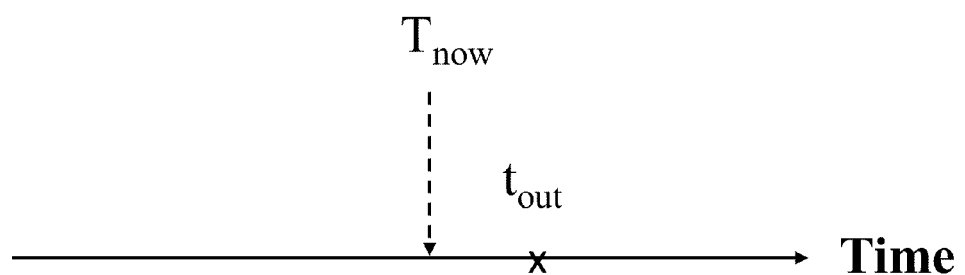

Step S440: It is determined whether the current time is the same as or later than an output time point for a read instruction associated with the i-th die. If so, it means that the data required by the read instruction associated with the i-th die is going to be ready, or has been already prepared, and the process proceeds to step S450. Otherwise, it means that the data required by the read instruction associated with the i-th die hasn't been prepared, and the process proceeds to step S460. For example, refer to FIG. 5. The upper (A) part shows the current time $T_{now}$ is later than the output time point $t_{out}$ for the read instruction associated with the i-th die. The lower (B) part shows the current time $T_{now}$ is earlier than the output time point $t_{out}$ for the read instruction associated with the i-th die.

Step S450: A random out instruction associated with the i-th die is issued to the flash I/F 139, which corresponds to the read instruction associated with the i-th die.

Step S460: The variable i is set to i+1.

Step S470: It is determined whether the value of variable i equals the total number of dies connected to this channel. If so, the process proceeds to step S410. Otherwise, the process proceeds to step S440.

It should be noted that those artisans may integrate the operation of step S420 into the operation of step S450, and invention should not be limited thereto.

Figure 6:
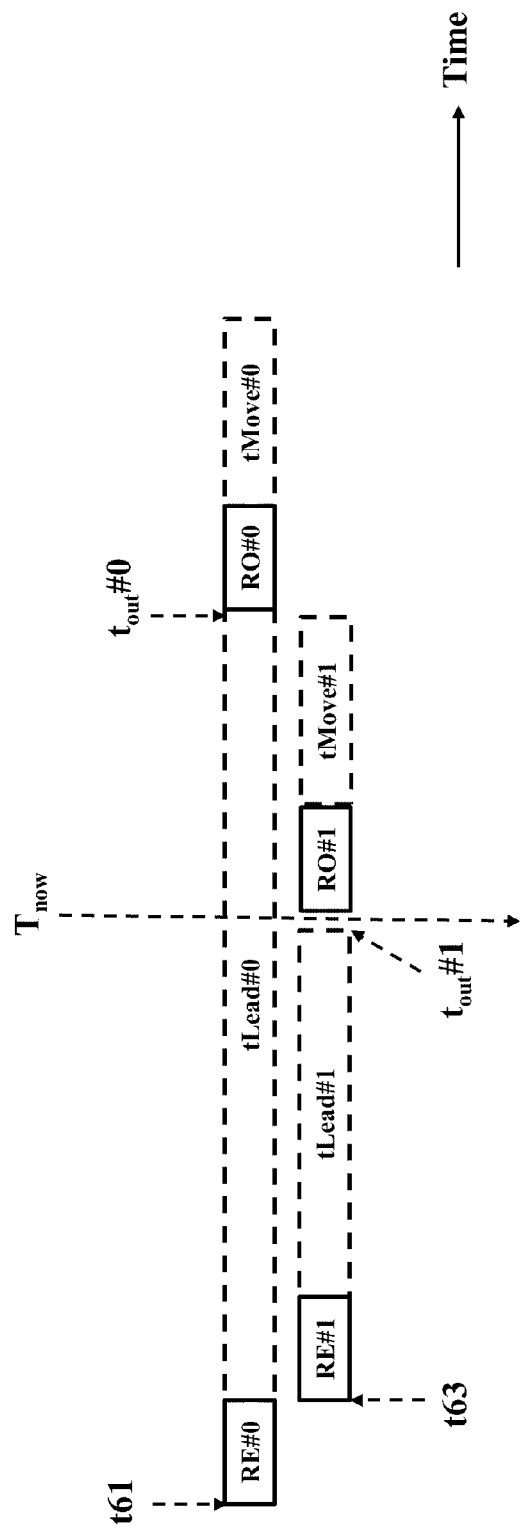
FIG. 6 is a sequence diagram showing issuances of read instructions and random out instructions according to an embodiment of the invention.

Refer to FIG. 6 illustrating the example with two NAND flash units (also referred to as dies) in the same channel. The processing unit 134 issues read instructions "RE #0" and "RE #1" to the flash I/F 139 at the time points t61 and t63 sequentially, and calculates output time points "$t_{out}$ #0" and "$t_{out}$ #1" for the read instructions "RE #0" and "RE #1", respectively, where the read instruction "RE #0" requests to read data from the designated location of the die "Die #0" in the flash module 150, and the read instruction "RE #1" requests to read data from the designated location of the die "Die #1" in the flash module 150 (step S410). Assume that the read lead time required for the read instruction "RE #0" is shown in the dotted box "tLead #0" in FIG. 6, the read lead time required for the read instruction "RE #1" is shown in the dotted box "tLead #1" in FIG. 6, and the read lead time "tLead #1" is shorter than the read lead time "tLead #0": Subsequently, when determining that the current time does not reach to, or is not later than the output time point "$t_{out}$ #0" for the read instruction "RE #0" associated with the die "Die #0" (the "No" path of step S440), the processing unit 134 does not perform any operation for the read instruction "RE #0". When determining that the current time is later than the output time point "$t_{out}$ #1" for the read instruction "RE #1" associated with the die "Die #1" (the "Yes" path of step S440), the processing unit 134 issues the corresponding random out instruction "RO #1" to the flash I/F 139 (step S450), thereby enabling the data requested by the read instruction "RE #1" to be stored in the designated location of the RAM 136 during the data output time period "tMove #1". Those artisans understand that the aforementioned method does not issue any wait for RB, or polling NAND status instruction to the flash I/F 139 for the previously issued read instructions, which would prevent the NAND bus from being occupied due to unnecessarily wait for RB, or polling NAND status instructions.

Some or all of the aforementioned embodiments of the method of the invention may be implemented in a computer program such as a driver for a dedicated hardware, a Firmware Translation Layer (FTL) of a storage device, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

Figure 4:
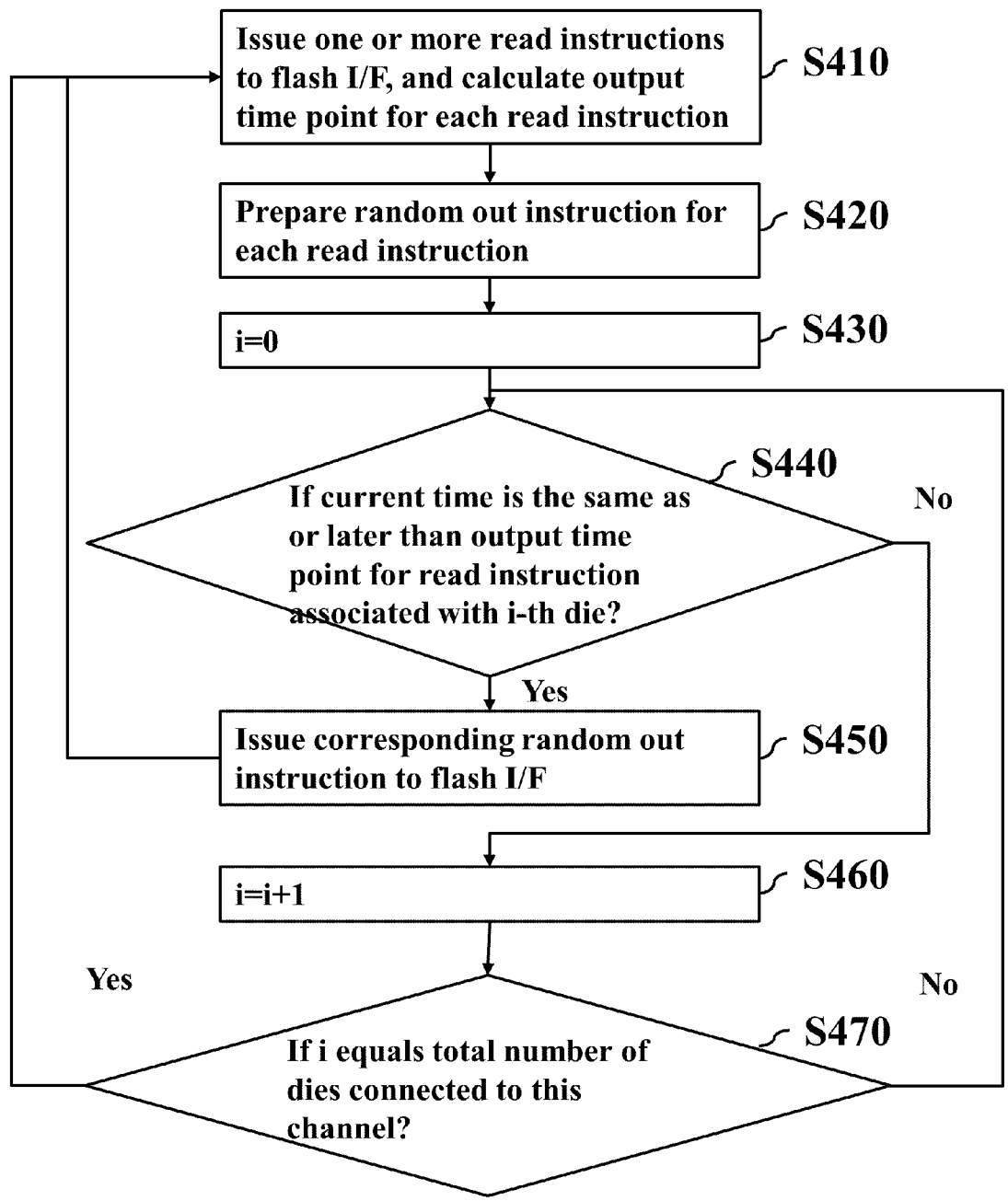
FIG. 4 is a flowchart illustrating a method for reading data from multiple flash dies according to an embodiment of the invention.

Although the embodiment has been described as having specific elements in FIGS. 1 and 2, it should be noted that additional elements may be included to achieve better performance without departing from the spirit of the invention. Each element of FIGS. 1 and 2 is composed of various circuits and arranged to operably perform the aforementioned operations. While the process flows described in FIG. 4 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for reading data from flash dies, performed by a processing unit when loading and executing program code, the method comprising:
   issuing a read instruction to a flash interface to drive the flash interface to activate a data read operation for reading data from a location in a die;

calculating an output time point corresponding to the read instruction; and issuing a random out instruction corresponding to the read instruction to the flash interface to drive the flash interface to store the data in a random access memory (RAM) when a second current time reaches to, or is later than the output time point, wherein the output time point is calculated by an equation:

$$t_{out}=T_{now}+t_{prep}$$

wherein $t_{out}$ represents the output time point corresponding to the read instruction, $T_{now}$ represents a timestamp of a first current time, at which the read instruction is issued, and $t_{prep}$ represents an estimated read lead time associated with the read instruction.

2. The method of claim 1, wherein the die requires a period of time to prepare the data.

3. The method of claim 1, wherein the estimated read lead time corresponds to the die associated with the read instruction.

4. The method of claim 1, wherein the estimated read lead time corresponds to the die and a memory unit type associated with the read instruction, and the memory unit type is a single level cell (SLC), a multi-level cell (MLC), a triple level cell (TLC), or a quad-level cell (QLC).

5. The method of claim 1, wherein the estimated read lead time corresponds to the die and a page type associated with the read instruction, and the page type is a single level cell (SLC) page, a lower page of a triple level cell (TLC) block, a middle page of the TLC block, or an upper page of the TLC block.

6. The method of claim 1, wherein the estimated read lead time corresponds to the die and a page type associated with the read instruction, and the page type is a single level cell (SLC) page, a lower page of a quad-level cell (QLC) block, a middle page of the QLC block, an upper page of the QLC block, or a top page of the QLC block.

7. A non-transitory computer program product for reading data from flash dies when loaded and executed by a processing unit, the non-transitory computer program product comprising program code to:

issue a read instruction to a flash interface to drive the flash interface to activate a data read operation for reading data from a location in a die;

calculate an output time point corresponding to the read instruction; and issue a random out instruction corresponding to the read instruction to the flash interface to drive the flash interface to store the data in a random access memory (RAM) when a second current time reaches to, or is later than the output time point, wherein the output time point is calculated by an equation:

$$t_{out}=T_{now}+t_{prep}$$

wherein $t_{out}$ represents the output time point corresponding to the read instruction, $T_{now}$ represents a timestamp of a first current time, at which the read instruction is issued, and $t_{prep}$ represents an estimated read lead time associated with the read instruction.

8. The non-transitory computer program product of claim 7, wherein the die requires a period of time to prepare the data.

9. The non-transitory computer program product of claim 7, wherein the estimated read lead time corresponds to the die associated with the read instruction.

10. The non-transitory computer program product of claim 7, wherein the estimated read lead time corresponds to the die and a memory unit type associated with the read instruction, and the memory unit type is a single level cell (SLC), a multi-level cell (MLC), a triple level cell (TLC), or a quad-level cell (QLC).

11. The non-transitory computer program product of claim 7, wherein the estimated read lead time corresponds to the die and a page type associated with the read instruction, and the page type is a single level cell (SLC) page, a lower page of a triple level cell (TLC) block, a middle page of the TLC block, or an upper page of the TLC block.

12. The non-transitory computer program product of claim 7, wherein the estimated read lead time corresponds to the die and a page type associated with the read instruction, and the page type is a single level cell (SLC) page, a lower page of a quad-level cell (QLC) block, a middle page of the QLC block, an upper page of the QLC block, or a top page of the QLC block.

13. An apparatus for reading data from flash dies, comprising:

a flash interface (I/F), coupled to a first die and a second die in a same channel; and a processing unit, coupled to the flash I/F, arranged operably to issue a first read instruction to the flash interface to drive the flash interface to activate a first data read operation for reading first data from a first location in the first die; calculate a first output time point corresponding to the first read instruction; issue a second read instruction to the flash interface to drive the flash interface to activate a second data read operation for reading second data from a second location in the second die; calculate a second output time point corresponding to the second read instruction; and issue a random out instruction corresponding to the second read instruction to the flash interface to drive the flash interface to store the second data in a random access memory (RAM) when a second current time is earlier than the first output time point, and the second current time reaches to, or is later than the second output time point, wherein the second output time point is calculated by an equation:

$$t_{out}=T_{now}+t_{prep}$$

wherein $t_{out}$ represents the second output time point corresponding to the second read instruction, $T_{now}$ represents a timestamp of a first current time, at which the second read instruction is issued, and $t_{prep}$ represents an estimated read lead time associated with the second read instruction.

14. The apparatus of claim 13, wherein the first die requires a first period of time to prepare the first data, and the second die requires a second period of time to prepare the second data.

15. The apparatus of claim 13, wherein the estimated read lead time corresponds to the second die associated with the second read instruction.

16. The apparatus of claim 13, wherein the estimated read lead time corresponds to the second die and a memory unit type associated with the second read instruction, and the memory unit type is a single level cell (SLC), a multi-level cell (MLC), a triple level cell (TLC), or a quad-level cell (QLC).

17. The apparatus of claim 13, wherein the estimated read lead time corresponds to the second die and a page type associated with the second read instruction, and the page type is a single level cell (SLC) page, a lower page of a triple level cell (TLC) block, a middle page of the TLC block, or an upper page of the TLC block.

18. The apparatus of claim 13, wherein the estimated read lead time corresponds to the second die and a page type associated with the second read instruction, and the page type is a single level cell (SLC) page, a lower page of a quad-level cell (QLC) block, a middle page of the QLC block, an upper page of the QLC block, or a top page of the QLC block.

* * * * *